United States Patent
Lee

(10) Patent No.: US 8,531,841 B2
(45) Date of Patent: Sep. 10, 2013

(54) IC THERMAL MANAGEMENT SYSTEM

(75) Inventor: Gordon K. Y. Lee, Allen, TX (US)

(73) Assignee: TDK-Lambda Corporation, Tokyo (JP)

( * ) Notice: Subject to any disclaimer, the term of this patent is extended or adjusted under 35 U.S.C. 154(b) by 0 days.

(21) Appl. No.: 12/912,476

(22) Filed: Oct. 26, 2010

(65) Prior Publication Data
US 2012/0099280 A1 Apr. 26, 2012

(51) Int. Cl.
H05K 7/20 (2006.01)

(52) U.S. Cl.
USPC ........... 361/708; 361/713; 361/720; 361/762; 174/252; 174/260; 439/66

(58) Field of Classification Search
None
See application file for complete search history.

(56) References Cited

U.S. PATENT DOCUMENTS

| | | | | |
|---|---|---|---|---|
| 5,390,078 A * | 2/1995 | Taylor | ............................ | 361/721 |
| 5,754,401 A * | 5/1998 | Saneinejad et al. | ............ | 361/705 |
| 5,812,374 A * | 9/1998 | Shuff | ............................ | 361/704 |
| 5,936,839 A | 8/1999 | Saito | | |
| 5,973,923 A * | 10/1999 | Jitaru | ............................ | 361/704 |
| 6,724,631 B2 * | 4/2004 | Ye et al. | ......................... | 361/719 |
| 7,440,282 B2 * | 10/2008 | Brandenburg et al. | ........ | 361/704 |
| 7,447,029 B2 * | 11/2008 | Lai et al. | ....................... | 361/700 |
| 7,623,349 B2 * | 11/2009 | Refai-Ahmed et al. | ....... | 361/719 |
| 2002/0008963 A1 * | 1/2002 | DiBene et al. | ................. | 361/720 |
| 2004/0212074 A1 * | 10/2004 | Divakar et al. | ................ | 257/698 |
| 2006/0126297 A1 * | 6/2006 | Belady et al. | .................. | 361/700 |
| 2008/0112139 A1 * | 5/2008 | Vinciarelli et al. | ............ | 361/709 |

* cited by examiner

Primary Examiner — Courtney Smith
(74) Attorney, Agent, or Firm — David W. Carstens; Kevin M. Klughart; Carstens & Cahoon, LLP

(57) ABSTRACT

The present invention provides a non-intrusive method for dissipating heat from open-frame DC-DC power converters where bottom side components are exposed. A thermal interface material is placed between the motherboard to which the power converter is soldered and power dissipating and temperature sensitive components on the bottom of the power converter. The thermal interface material fills the gap between the power converter components and the motherboard, thereby providing a heat conductive path for dissipating heat from the power converter to the motherboard.

6 Claims, 4 Drawing Sheets

IC THERMAL MANAGEMENT SYSTEM

TECHNICAL FIELD

The present invention relates in general to power converter modules and more specifically to a method of improved heat dissipation from power modules.

BACKGROUND OF THE INVENTION

DC-DC converters are common electronic components that take a first input voltage and convert it into one or more output voltages. This allows a user to take, for example, a higher battery voltage, such as 48 volts, and convert it down to a first and second output voltage, such as 12 volts and 5 volts, enabling the higher voltage DC source to be used to power various circuits that require lower voltage. Such a converter can provide either a single output voltage or multiple voltage outputs. One of the primary operating concerns of DC-DC power converts is the generation of heat, which can compromise the performance of and potentially damage electronic components, particularly within the confined spaces of modern electronic systems.

The trend in power devices is to deliver more power within a smaller volume of space (power density). As this trend of increased power density continues, there is a greater demand for better thermal management, which is becoming a larger percentage of the total cost of the product.

Several methods and component configurations have been used in the past to facilitate the dissipation of heat from DC-DC converters. Typical thermal management methods involve transferring heat through the top surface of the power converter and rely on conduction and convection heat transfer. The most common methods involve some form of thermal interface material coupling the top surface of the power converter to a case or baseplate. A heatsink is often mounted onto the case/baseplate to enhance convection cooling to ambient air (see FIG. 2). Another common method in applications involving little to no forced airflow is to conduct the heat from the top surface of the power converter through a thermal interface material to a metal surface that is typically part of a clamshell assembly.

The prior art methods described above normally involve some machining or forming of metal to fit with the profile of the power converter and to create the heatsink/clamshell. Depending on the size, material and manufacturing method used, it can get considerably expensive to implement these methods. These methods of thermal management also add weight to the converter, which can result in additional stress to the converter structure. Special care also needs to be given to the assembly and sequence of assembly to minimize stress on the converter solder joints.

Because the prior art methods transfer heat from the top surface to the environment, the converter needs to be designed in a specific way to take full advantage of this approach. Therefore, heavy power dissipating parts and/or temperature sensitive parts need to be placed on the top side of the converter in order for the above thermal management methods to have maximum benefit. Unfortunately, this requirement considerably reduces the design flexibility of the layout of the power module.

With power converters measured by watts/dollar, there is increasing demand for lower cost thermal management with each new generation of products. With higher power densities and smaller form factors, thermal management solutions need to have as small a footprint as possible.

SUMMARY OF THE INVENTION

The present invention provides a method for dissipating heat from DC-DC power converters. A thermal interface material is placed between the motherboard to which the power converter is soldered and power dissipating and temperature sensitive components on the bottom of the power converter. The thermal interface material fills the gap between the power converter components and the motherboard, thereby providing a heat conductive path for dissipating heat from the power converter to the motherboard. The present invention thereby provides a simple, non-intrusive method of providing underfill and heat dissipation.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, wherein:

DETAILED DESCRIPTION OF THE DRAWINGS

Figure 1:
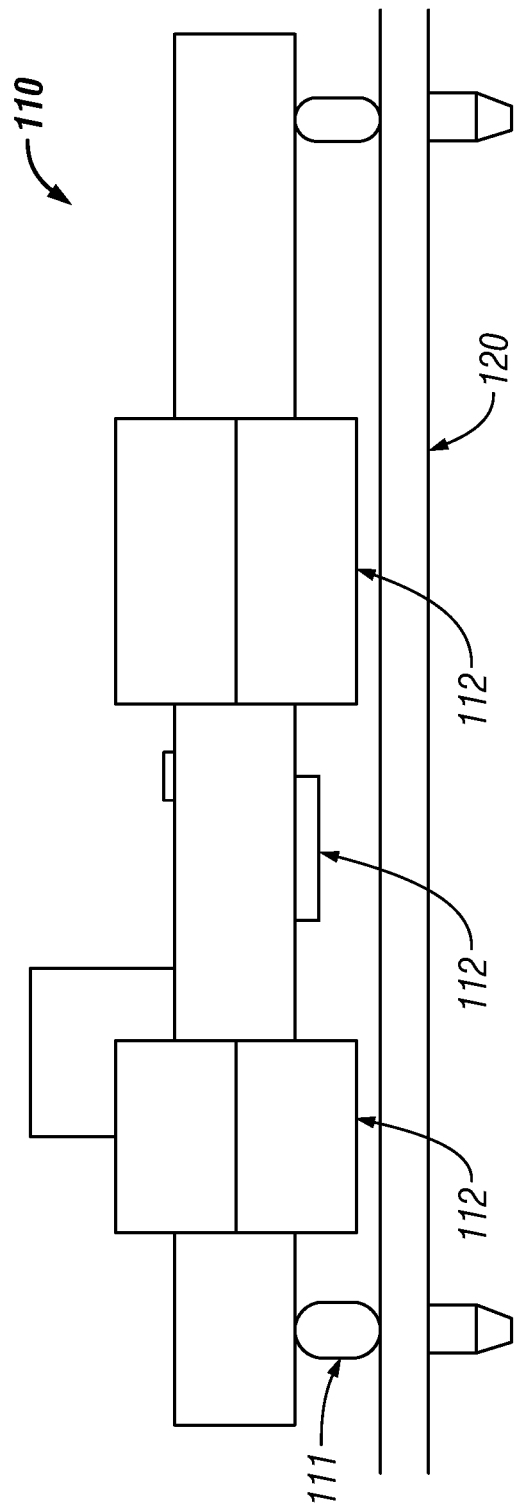
FIG. 1 shows a DC-DC power converter module mounted to a motherboard in accordance with the prior art.

FIG. 1 shows a DC-DC power converter module mounted to a motherboard in accordance with the prior art. The power converter 110 is mounted to the motherboard 120 by means of connector posts 111. The power converter 110 includes heat-generating electronic components 112 (e.g. planar magnetic devices and power semiconductor switching devices such as MOSFETs, IGBTs, GaN devices, power transistors, etc). As shown in FIG. 1, there is a gap between the heat-generating components 112 and the motherboard 120. In this example, heat must be dissipated from the converter module 110 via heat convection into the ambient air, requiring some type of forced airflow to achieve any effective degree of thermal management.

Figure 2:
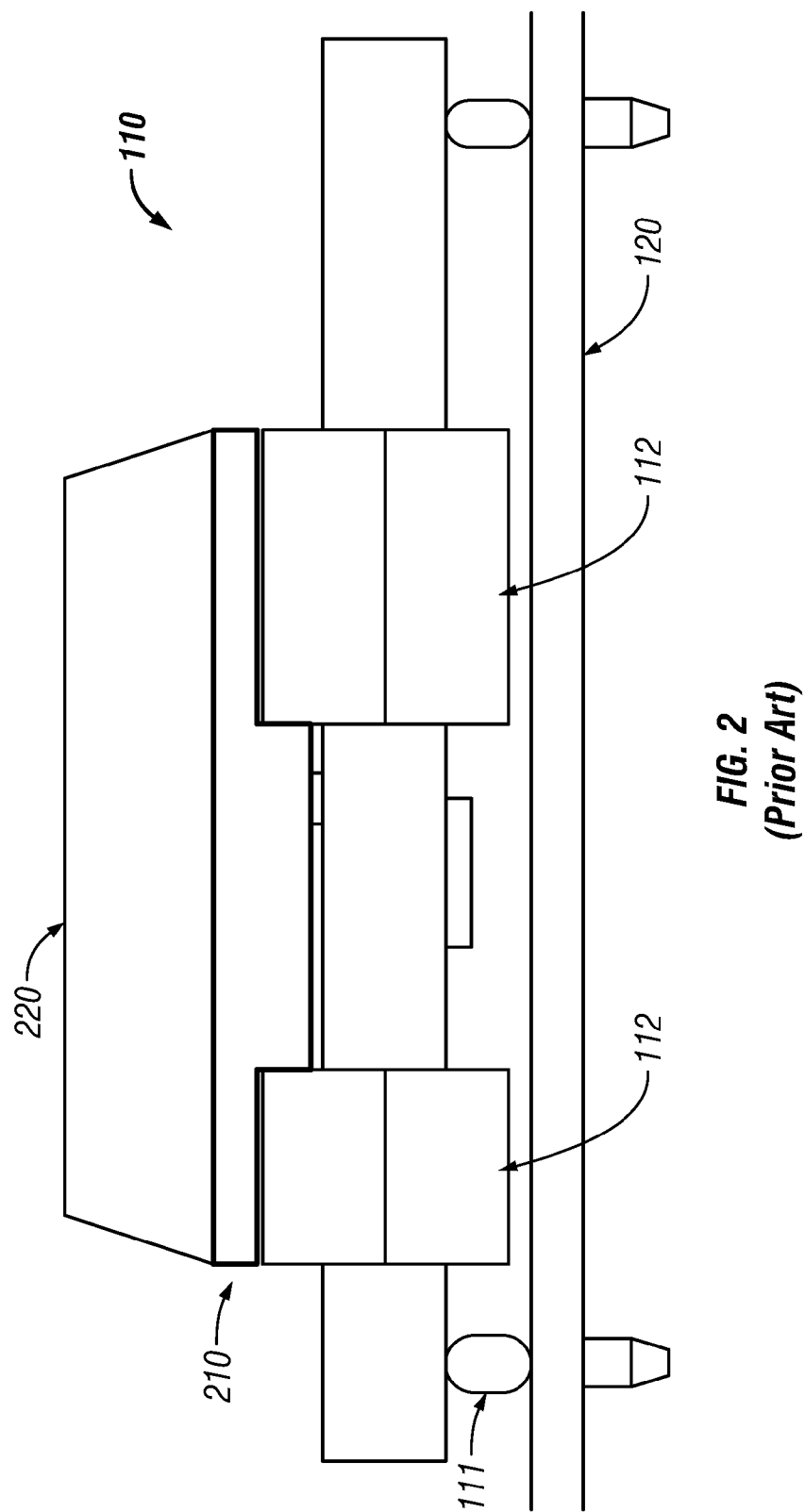
FIG. 2 shows a DC-DC power converter with a base plate heat sink mounted on the top of the module in accordance with the prior art.

FIG. 2 shows a DC-DC power converter with a baseplate and heatsink mounted on the top of the module in accordance with the prior art. In this embodiment, a baseplate 210 is mounted to the top of the power module 110, which allows direct thermal conduction from the heat-generating components 112. Though some heat convection will occur in the space underneath the power module 110, in this configuration most heat will be dissipated via the baseplate 210. A heatsink 220 is coupled to the baseplate to provide a larger surface for heat convection to ambient air.

Unfortunately, as is obvious from the figure, inclusion of the baseplate 210 and heat sink 220 requires substantial space above the power converter 110 to accommodate the heatsink, making it an impractical design for system configurations in which space restrictions are tight. And as explained in the background section, this method may require forming the baseplate to fit with the profile of the power converter and to create the heatsink, while adding weight to the converter, which can result in additional stress to the structure. The baseplate can also add considerable cost in materials and assembly, while increasing the environmental footprint of the product. During assembly into the mother board, the added thermal mass of the baseplate can also make the soldering or rework processes more difficult.

The present invention overcomes the limitations of the prior art and improves thermal management by conducting heat from the bottom side of the converter module through a thermal interface material (underfill) to the Printed Wiring Board (motherboard) on which the power converter is soldered.

Figure 3:
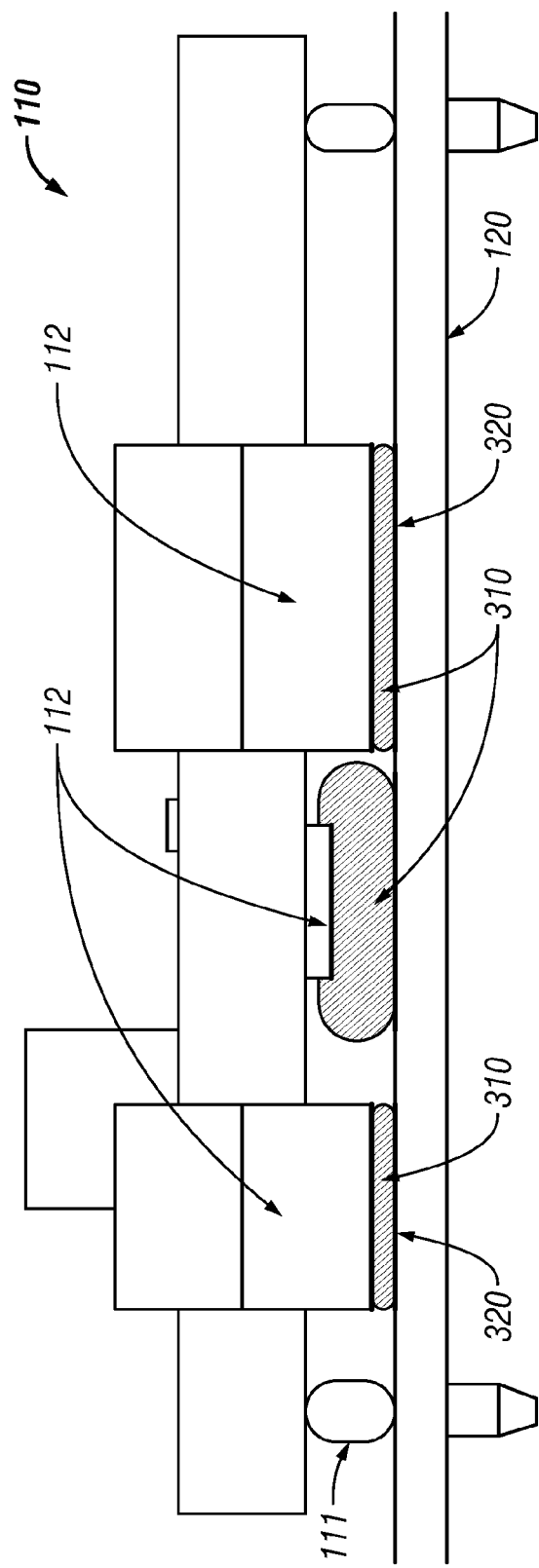
FIG. 3 shows a DC-DC power converter module with a thermal underfill in accordance with the present invention.

FIG. 3 shows an open-frame (bottom side components exposed) DC-DC power converter module with a thermal underfill in accordance with the present invention. In one embodiment of the present invention, thermally conductive, but electrically insulating underfill 310 is placed on the bottom of heat-generating/temperature sensitive components 112 of the power converter 110 either during assembly of the module or assembly of the motherboard. The underfill 310 occupies the space that was left empty in the prior art configuration shown in FIG. 1, allowing heat conduction through the motherboard 120, thereby using the motherboard as a heatsink.

In one embodiment of the present invention, the underfill is a compliant thermal pad 310 and is used in conjunction with a double-sided pressure sensitive adhesive 320 to provide the required compression on the pad. This allows the thermal management solution of the present invention to be sold as a stand alone product to customers without requiring special features put into the motherboard or any special process to assemble the power converter module onto the motherboard.

The underfill cooling method of the present invention has the benefits of lower cost and higher reliability over prior art methods. It does not require heavy baseplates and heatsinks or fixing the power converter to a rigid body that could potentially stress the converter's solder joints. The present invention also allows for direct cooling of components on the bottom side of the converter, thereby providing the flexibility of placing high power dissipating components or temperature sensitive components on the under side of the converter, thus avoiding the component configuration restrictions of the prior art.

Because the underfill cooling method of the present inventions relies primarily on conduction rather than convection, little to no forced air is required for effective cooling. This is particularly advantageous for open frame modules. The present invention can cool the module with or without forced convection giving flexibility to the system design. It is especially effective without forced convection, as it becomes the main mode of heat transfer.

The thermal interface material 310 used for the underfill can be either a compliant pad or liquid filling material that sets when cured. The thermal interface 310 typically requires some compression to transfer heat effectively. Therefore, a downward force is applied to the converter module 110 to achieve this compression. There are several available methods for applying this downward force, some of which involve the use of spring loaded clips or hardware. However, the drawback with such methods is that they require valuable isolated surface space, both on the power converter and the motherboard. Other potential drawbacks are that the customer may be required to design special features into its motherboard and/or use special assembly processes.

One embodiment of the present invention overcomes these problems by using a double-sided, pressure-sensitive adhesive tape 320 to hold the power converter 110 to the motherboard 120, ensuring consistent heat transfer over and through the whole area of the underfill thermal material 310. The double-sided tape 320 may be thermally conductive yet electrically isolating so it too can provide a path for conducting heat. The double-sided tape 320 can be placed on any surface of the power converter that is close to the motherboard. The tape size and adhesion strength should be sufficient to hold the compression on the thermal interface material until the converter is soldered onto the motherboard. These parameters depend on the type of thermal pad used, as some are more compliant than others and some require more compression than others.

The thermal interface material 310 can be either a compliant pad (e.g., Bergquist Gap Pad) or liquid filling material that sets when cured. One such liquid filling material is Gap Filler 2000, which is a thermally conductive liquid material supplied as a two-component curing system that produces a soft elastomer with good compression set (memory) that is designed for fragile and low-stress applications. The material will cure at either ambient or elevated temperature to form a soft interface material with a thermal conductivity of 2.0 W/m-K.

Other products that are similar to the Bergquist Gap Pad are the Laird Tflex products. Other companies such as Denka or Chomerics (Therm-A-Gap product line) produce thermal pads as well.

The present invention provides considerable improvement over prior art configurations regarding the relationship between output current and ambient temperature. Using underfill material in the manner of the present invention produces significant improvement in usable power (rated output power in a given thermal environment) in comparison to a stand alone module or even a module using a baseplate configuration. In one experiment, there was a 45% improvement in usable power (65 C, 200 LFM) when the underfill material was used, in contrast to about a 14-18% improvement in usable power when using a baseplate design. At natural convection, the improvement was even greater at 50% increase.

Using Gap Filler 2000 as the underfill material, the usable power of a 3.3V test module was 79 W. Without the underfill the module had only 54 W of usable power. This is a 45% increase in usable power with the Gap Filler 2000 as the thermal interface material. Of course these results will vary with different thermal interface materials, but they demonstrate the potential for dramatically increasing usable power.

As with all methods of thermal management, improvements in usable power will depend on the module's operating environment. Heat transfer to the motherboard becomes less efficient as the temperature difference between the module and motherboard decreases. Nevertheless, the gains in usable power are considerable, even when tempered by higher motherboard temperatures.

Figure 4:
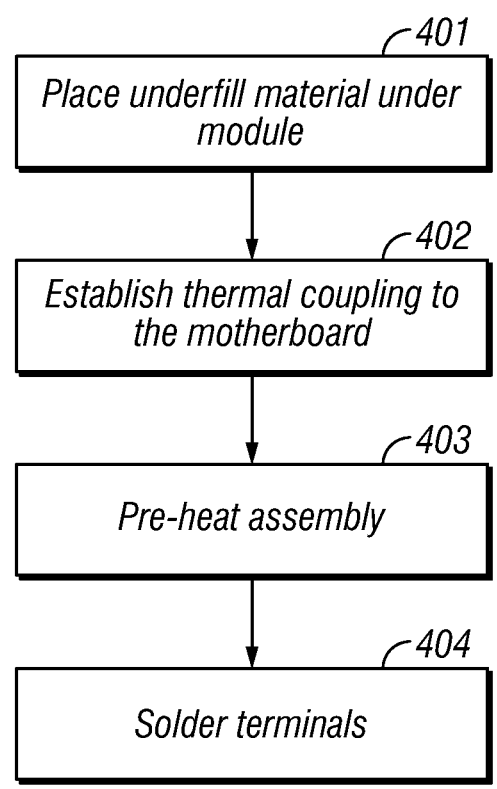
FIG. 4 is a flowchart showing a manufacturing method using underfill thermal management.

FIG. 4 is a flowchart showing a manufacturing method using underfill thermal management. The first step involves placing the underfill thermal pad under the bottom of the module by means of double-sided tape as describe above (step 401). In the case where a power converter module is sold as a prefabricated unit to a third party customer, the thermal pad and double sided adhesive tape may already be adhered to the bottom of the module.

The module is then coupled thermally to the motherboard by aligning the pins on the module with the proper holes on the motherboard and making sure the module is properly seated (step 402). To ensure all voids are filled, pressure is applied to the module to compress the thermal interface material and ensure complete contact and adhesion of the material to the motherboard and module.

After the power converter module is aligned and securely coupled to the motherboard, the next step is to pre-heat the assembly in an oven (step 403). After the pre-heat, the last step is to solder the terminals of the assembly, often using a wave soldering, fountain soldering, or hand soldering operation (step 404). In some cases, reflow soldering could also be applied.

The present invention has the advantage of using current production methods and merely adding an additional step at the beginning without the need to change the rest of the assembly method for the motherboard. The present invention thereby provides a simple, non-intrusive method of providing underfill and heat dissipation.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated. It will be understood by one of ordinary skill in the art that numerous variations will be possible to the disclosed embodiments without going outside the scope of the invention as disclosed in the claims.

I claim:

1. A method of dissipating heat from a dc-dc power converter, the method comprising the steps of:
   (a) placing a compressible electrically insulating underfill thermal interface material in contact with the button of the power converter; and
   (b) placing the compressible electrically insulating underfill thermal interfaces material contacting the bottom of the power converter in contact with a motherboard;
   wherein
   the compressible electrically insulating underfill thermal interface material fills space between the bottom of the power converter and the surface of the motherboard and thereby provides a heat conductive path that transfers heat from the power converter to the motherboard printed wiring;
   the compressible electrically insulating underfill thermal interface material is in the form of a compliant compressible thermal pad; and
   double sided adhesive tape is attached to components on the power converter to provide a non-intrusive method of attaching the power converter to the motherboard while providing compression for the thermal pad.

2. The method according to claim 1, wherein step (a) is performed during manufacture of the power converter as a stand alone product.

3. The method according to claim 1, further comprising compresssing the compressible electrically insulating underfill thermal interface material during step (b) to increase efficiency of heat transfer.

4. The method according to claim 1, wherein beat conduction through the compressible electrically insulating underfill thermal interface material to the motherboard cools the power converter.

5. The method according to claim 1, wherein the power converter comprises an open-frame construction with bottom side components exposed prior to contacting the power converter to the motherboard through the compressible electrically insulating underfill thermal interface material.

6. The method according to claim 1, wherein the compressible electrically insulating underfill thermal interface material comprises BERGQUIST GAP PAD.

\* \* \* \* \*